(12) United States Patent
Miyairi et al.

(10) Patent No.: US 7,422,347 B2
(45) Date of Patent: Sep. 9, 2008

(54) PLANAR LIGHT SOURCE AND PLANAR LIGHTING APPARATUS

(75) Inventors: Hiroshi Miyairi, Anan (JP); Kazunori Watanabe, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/276,545

(22) Filed: Mar. 6, 2006

(65) Prior Publication Data
US 2006/0198144 A1    Sep. 7, 2006

(30) Foreign Application Priority Data
Mar. 7, 2005    (JP) ............................. 2005-062264

(51) Int. Cl.
*F21V 5/00* (2006.01)
(52) U.S. Cl. ..................... 362/335; 362/326; 362/332; 362/333; 362/331
(58) Field of Classification Search ......... 362/333–336, 362/311, 329, 327, 244, 337–340, 308, 309, 362/326, 331; 359/707–708, 710, 652–654; 313/110–112
See application file for complete search history.

(56) References Cited

U.S. PATENT DOCUMENTS

| 2,254,962 | A | * | 9/1941 | Harris et al. ................ 362/327 |
| 5,485,317 | A | * | 1/1996 | Perissinotto et al. ........ 359/712 |
| 6,900,587 | B2 | * | 5/2005 | Suehiro et al. ............. 313/503 |
| 6,945,672 | B2 | * | 9/2005 | Du et al. ..................... 362/241 |
| 7,029,147 | B2 | * | 4/2006 | Nawashiro ................. 362/236 |
| 7,111,964 | B2 | * | 9/2006 | Suehiro et al. ............. 362/328 |
| 7,153,000 | B2 | * | 12/2006 | Park et al. .................. 362/268 |
| 2004/0061433 | A1 | | 4/2004 | Izuno et al. |
| 2004/0114371 | A1 | * | 6/2004 | Lea et al. .................... 362/297 |
| 2005/0007777 | A1 | * | 1/2005 | Klipstein et al. ........... 362/244 |
| 2005/0052878 | A1 | | 3/2005 | Yamada et al. |
| 2005/0122711 | A1 | * | 6/2005 | Matthews et al. .......... 362/184 |
| 2005/0157495 | A1 | * | 7/2005 | Bruck ......................... 362/240 |

FOREIGN PATENT DOCUMENTS

| JP | 2003/57622 A | 2/2003 |
| JP | 2005/8844 A | 1/2005 |

* cited by examiner

*Primary Examiner*—John A. Ward
*Assistant Examiner*—Robert May
(74) *Attorney, Agent, or Firm*—Global IP Counselors, LLP

(57) ABSTRACT

A planar light source comprises at least one point light source disposed on a supporting substrate, and a cylindrical lens that covers the light emitting observation side of the point light source, wherein the cylindrical lens has a concave lens function in the direction (y direction) perpendicular to the supporting substrate, and has a convex lens function in at least part of the horizontal direction (x direction).

17 Claims, 15 Drawing Sheets

Supporting Substrate
Focal Point Of Portion Having Convex Lens Function
Position Of Point Light Source

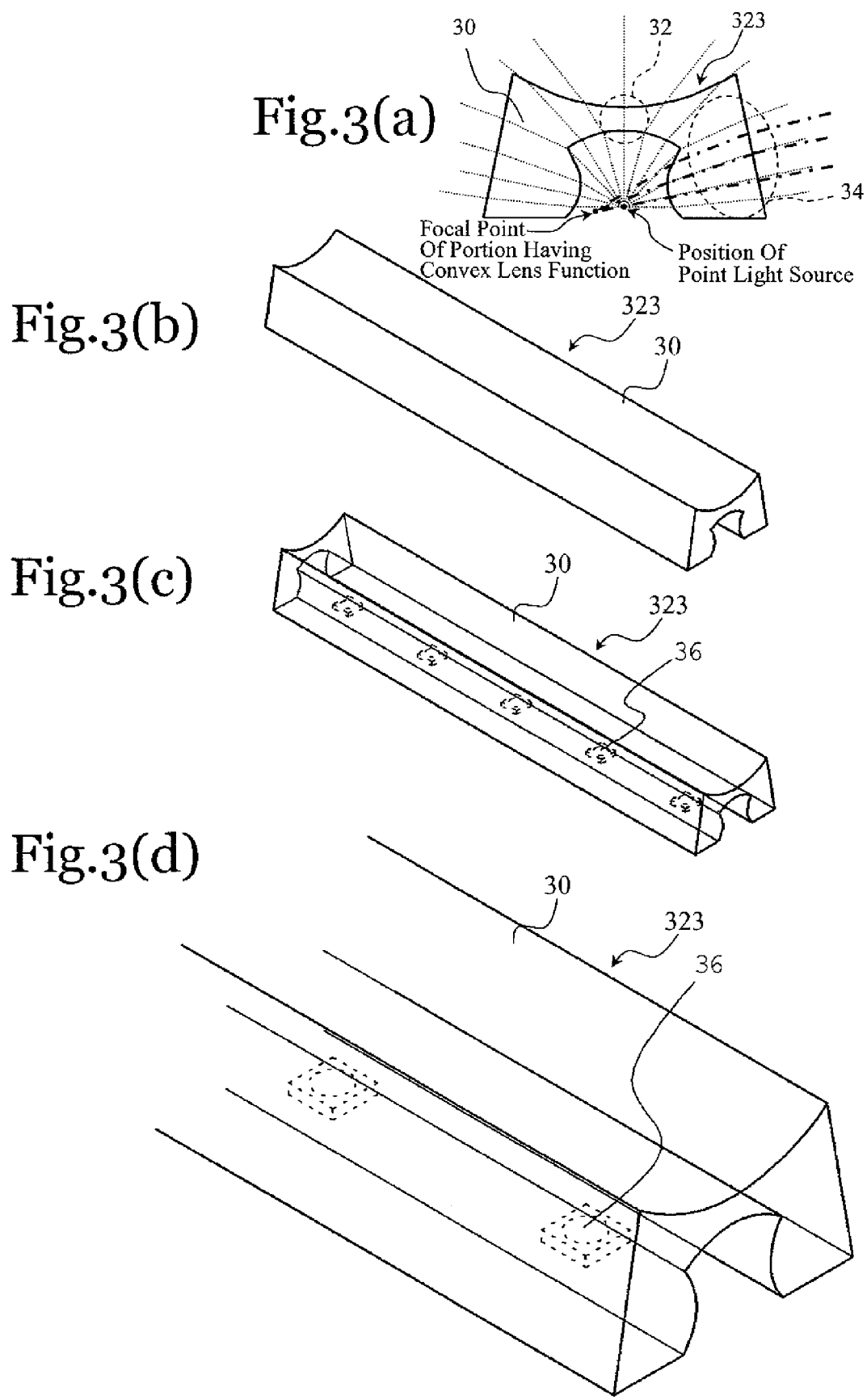

Focal Point Of Portion Having Convex Lens Function

Position Of Point Light Source

Focal Point Of Portion Having Convex Lens Function

Position Of Point Light Source

Focal Point Of Portion Having Convex Lens Function    Position Of Point Light Source Focal Point Of Portion Having Convex Lens Function Position Of Point Light Source

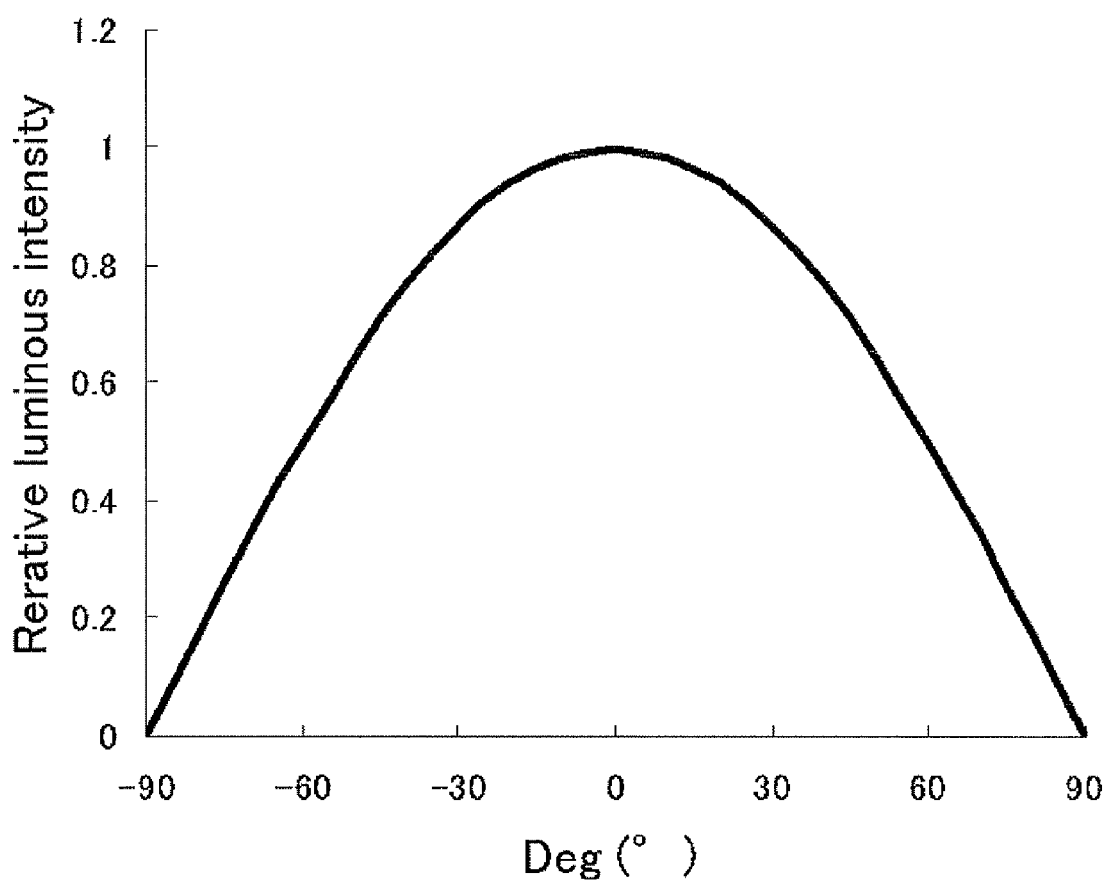

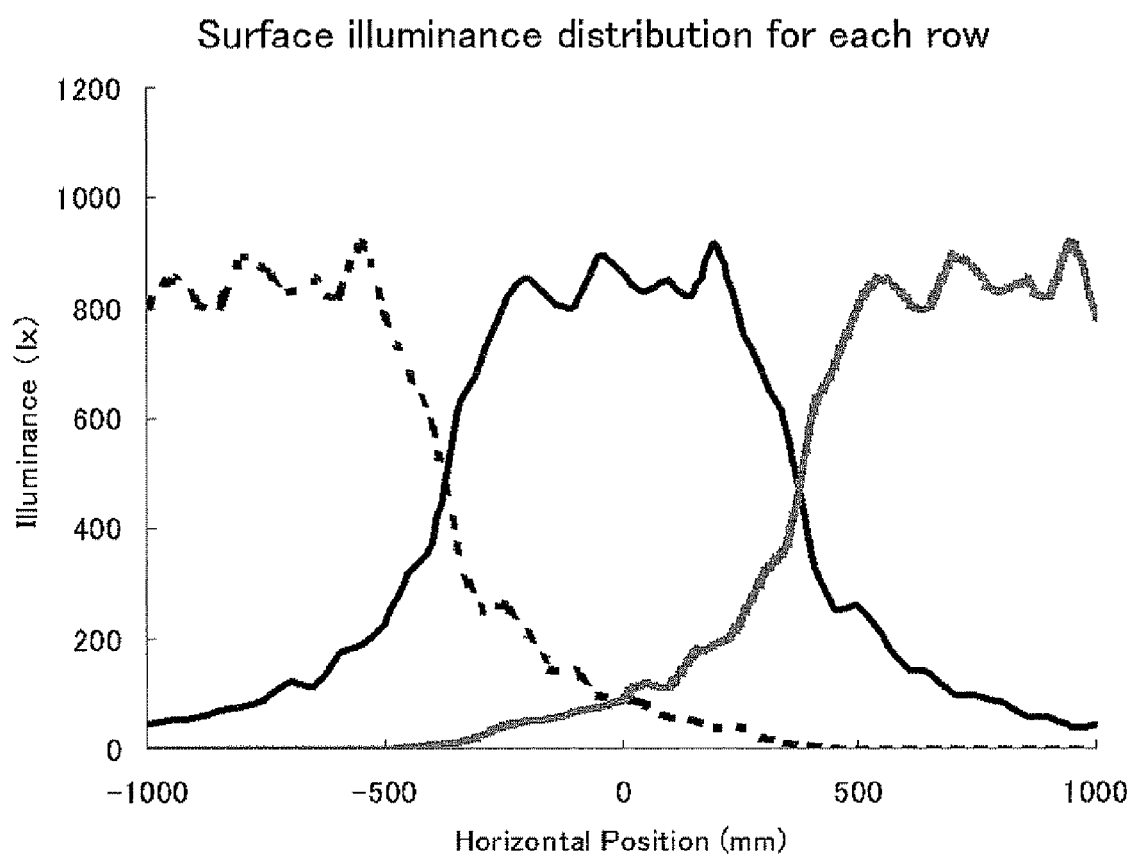

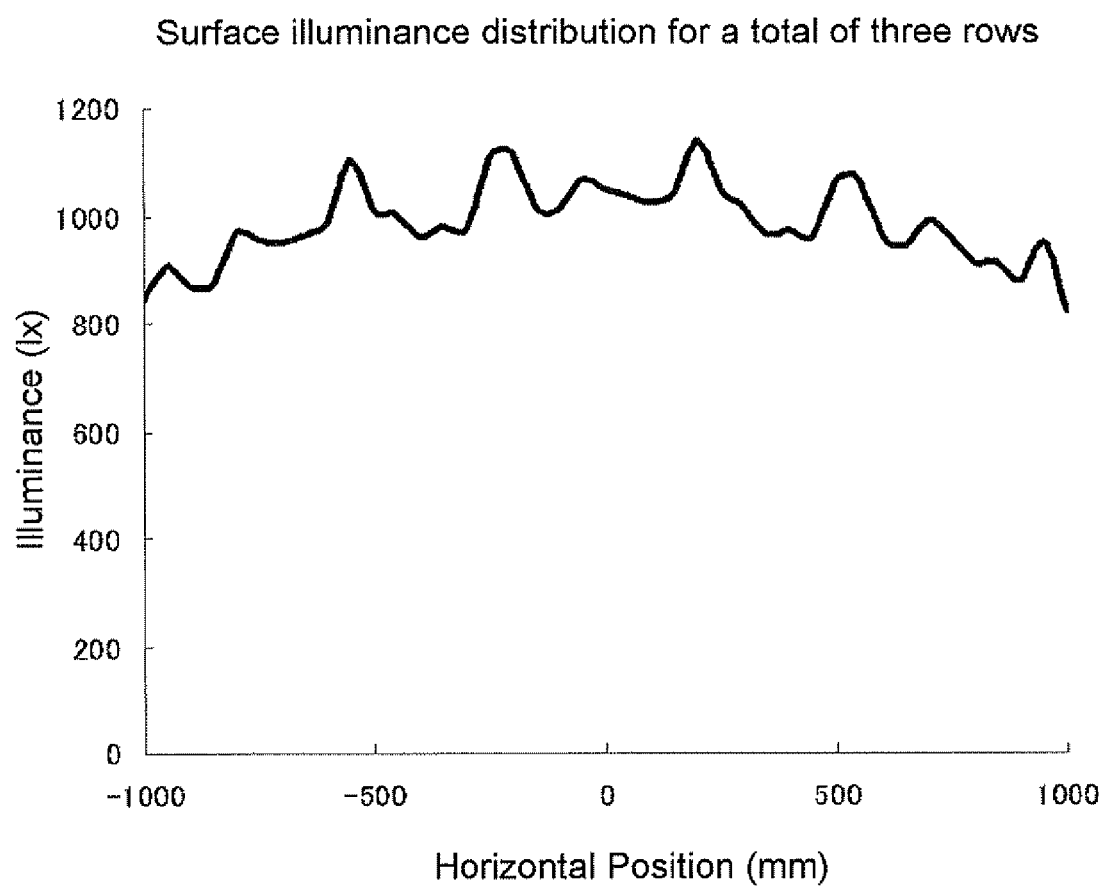

PLANAR LIGHT SOURCE AND PLANAR LIGHTING APPARATUS

BACKGROUND OF THE INVENTION

1. Field of the Invention

The present invention relates to a planar light source and a planar lighting apparatus, and more particularly relates to a planar light source used in backlight light sources for liquid crystal display devices used in channel letters and in image displays such as television sets, word processors, and computers.

2. Background Information

Liquid crystal display devices having a backlight light source are beginning to be used in portable electronic devices and various kinds of image display devices. A liquid crystal display device is usually made up of a light-guide plate, a liquid crystal cell, a prism sheet, a diffuser, a backlight light source, and so forth (see Japanese Laid-Open Patent Application 2003-57622, for example). However, as the display devices used in liquid crystal displays have become larger in size, we are beginning to see the development of liquid crystal displays which do not make use of a light diffuser, which was an essential constituent element of conventional liquid crystal displays. This is because it is difficult to produce a large light diffuser, and large display devices need to be made thinner and more lightweight.

Also, a backlight light source has usually been used as a planar light source in which the core light source utilizes a linear light source comprising a fluorescent lamp. Nevertheless, out of a desire for lower power consumption and longer service life, there is a move toward using backlight light sources comprising light emitting diode s, with which rapid progress has been made in terms of increasing brightness.

Meanwhile, fluorescent lamps and the like have been used not only in display devices, but also in display refrigerators and so forth, which are used to hold bottled water and other products on display in convenience stores and so on. Ironically, because of their poor temperature characteristics at low temperatures, fluorescent lamps have to be heated with a nearby heater despite the fact that they are used in a refrigerator. In view of this, a transition is underway from fluorescent lamps and other such light sources toward light emitting diodes in order to avoid this situation and to reduce power consumption and extend service life.

When a planar light source whose structure includes no light-guide plate is employed in a display device or the like, the action of guiding the light in planar fashion is diminished. Fluorescent lamps and other such linear light sources as the core light source have been used for backlight light sources, and have been obtained as planar, that is, two-dimensional, light sources. Consequently, if the core light source is a linear light source, that is, one-dimensional, all that needs to be done is to raise the dimension by one.

However, when the core light source is a point light source, that is, zero-dimensional, the dimension has to be raised by two, so it is difficult to attain the appropriate brightness, uniform light emission, and so forth. Specifically, when a light emitting diode constitutes a planar light source whose structure includes no light-guide plate, the portions located directly above the light emitting diode become bright spots, and it is difficult to make the light be emitted uniformly throughout the plane. Also, when red, blue, and green light emitting diode chips are separately packaged and then combined to produce white light, color unevenness results.

Also, with a display refrigerator, the whole front is covered with glass, and a light source cannot be installed at this glass portion. Therefore, due to structural limitations, this requires the use of a system in which light emitting diodes are installed vertically at the edges of sliding doors. In this case, emitting the light over a wider range has been attempted by attaching a side emitter lens or a Lambertian lens to every light emitting diode, but it is difficult to prevent the occurrence of bright lines and bright spots due to the difference in optical paths attributable to the difference in the physical distances from the light emitting diode.

SUMMARY OF THE INVENTION

The present invention provides a planar light source comprising at least one point light source disposed on a supporting substrate, and a cylindrical lens that covers the light emitting observation side of the point light source, wherein the cylindrical lens has a concave lens function in the direction (y direction) perpendicular to the supporting substrate, and has a convex lens function in at least part of the horizontal direction (x direction).

Further, the present invention provides a planar lighting apparatus comprising planar light sources of the above installed in the x direction at regular intervals.

According to the planar light source of the present invention, even if structure includes no light-guide plate is employed in a display device or the like, the action of guiding the light in planar fashion can be improved. In addition, it is realized to prevent the occurrence of bright lines and bright spots as well as color unevenness, and suitable brightness and suitable uniform luminescence can be realized. Moreover, the planar light source which has higher brightness, uniform luminescence, higher color mixing property with sufficient balance can be obtained. This allows the planar light source to be more lightweight, thinner and low power consumption.

In particular, uniform planar over a wide range can be accomplished by installing planar light sources of the present invention at regular intervals in the x direction. Also, in applications such as a store window or display case, the displayed merchandise can be uniformly illuminated and the merchandise can be displayed without any bright lines or bright spots.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 3(a) is a side view of an embodiment of the planar light source of the present invention, FIG. 3(b) is an oblique view thereof, FIG. 3(c) is a see-through oblique view, and FIG. 3(d) is a detail oblique view of the main components;

FIG. 9 is a graph showing Lambertian light distribution characteristics;

FIG. 14 is a graph of the illuminance distribution of a surface illuminated by planar light sources per row used in a display refrigerator; and FIG. 15 is a graph of the illuminance distribution of a surface illuminated by a total of three rows of planar light sources used in a display refrigerator.

DETAILED DESCRIPTION OF THE PREFERRED EMBODIMENTS

Figure 1A:
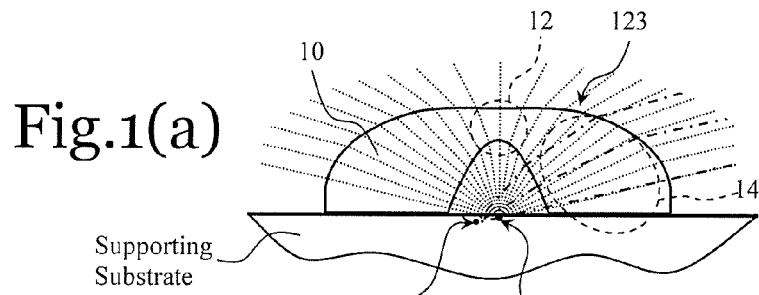
FIG. 1(a) is a side view of an embodiment of the planar light source of the present invention.

Preferred embodiments for working the present invention will now be described through reference to the drawings, but the following embodiments are merely examples of a planar light source and a planar lighting apparatus for the purpose of specifically embodying the technological concepts of the present invention, and the present invention is not limited to these embodiments. Also, the size of components shown in the drawings, their positional relationship, and so forth may be exaggerated in order to clarify the description.

As shown in FIGS. 1(a) to 1(d), the planar light source 123 of the present invention comprises at least one point light source 16 disposed on a supporting substrate (e.g., a heat sink 128 shown in FIG. 12), and a cylindrical lens 10 that covers the light emitting observation side of the point light source 16, that has a portion 12 having a concave lens function in the direction (y direction) perpendicular to the supporting substrate, and that has a portion 14 having a convex lens function in at least part of the horizontal direction (x direction).

The supporting substrate may be made of any material as long as it is able to support the point light source 16 and the cylindrical lens 10. Examples include an aluminum-based substrate, a copper-based substrate, and a glass epoxy-based substrate. The "aluminum-based substrate" is one in which the mounting surface side of an aluminum plate is covered with an insulating film, and refers to one in which a wiring pattern for a point light source is provided on this insulating film, or to one which is actually wired. "Copper-based substrate" refers to one in which the aluminum in an aluminum substrate is replaced with copper. "Glass epoxy substrate" refers to one in which the aluminum is replaced with a plate composed of a glass epoxy resin. The supporting substrate may have an integral design, or may consist of a plurality of parts. A fan or some other such means for dispersing heat is preferably provided on the back side of these substrates.

There are many different kinds of point light source that can be used as the point light source 16, but a light emitting diode is preferable in terms of higher brightness and lower power consumption. This is because such light emitting diodes afford a planar light source that consumes less power and has a longer service life. Also, when used in a cold environment, such as in refrigeration applications, these light emitting diodes maintain or increase the light emission efficiency. Types of package for the light emitting diode include a bullet-type and a surface mount type (e.g., top view type, and side view type), among which the surface mount type is preferable, especially, from the standpoints of higher brightness and better heat dissipation, the top view type is more preferable.

It is particularly favorable for the point light source 16 to emit light that has orientation characteristics with a cosine curve relative to the x and y directions. "Orientation characteristics with a cosine curve relative to the x and y directions" means that light is emitted in the form of a circular plane, and means that the intensity of the light is highest at the position directly across from the point light source 16, with the light being attenuated to the sides away from this position, the light can no longer be detected at the point of 90° lateral deviation relative to the perpendicular direction, so that the orientation characteristics resemble a cosine curve. Orientation characteristics such as these are also called Lambertian light distribution characteristics (see FIG. 9, where the perpendicular direction is indicated as 0°).

A light emitting diode that is a favorable example of the point light source 16 is one in which light emitting diode chips have been packaged with a sealing resin, and preferably a fluorescent substance that converts the wavelength of the light emitted from the light emitting diode chips is covered within the package. This allows light of any wavelength to be obtained, and light of a plurality of wavelengths to be easily mixed, regardless of the wavelength of the light emitted from the light emitting diode chips. One that converts the light from the light emitting diode chips into a long wavelength is particularly favorable because of its good light emission efficiency. As a result, high-brightness white light can be obtained. The package of the light emitting diode may comprise two or more light emitting diode chips. Also, one kind of fluorescent substance may be packaged in a single layer, or two or more kinds of fluorescent substance may be packaged in a mixed state in a single layer, or in a separated state in a single layer, or in a mixed or separated state in multiple layers.

From the standpoints of high optical absorbancy and conversion efficiency, and a wide excitation wavelength width, the fluorescent substance preferably has a median particle size of 1 to 100 µm, and even more preferably 6 to 50 µm, with a range of 15 to 30 µm being better yet. The various fluorescent materials and so forth listed below are examples of this fluorescent substance.

(Aluminum Oxide-Based Fluorescent Materials)

Aluminum oxide-based fluorescent materials are fluorescent substances which include Al, and at least one element selected from Y, Lu, Sc, La, Gd, Tb, Eu and Sm; together with Ga and/or In, and is activated by at least one element selected from rare earth elements, as described in WO03-034508. They are excited by visible light or ultraviolet light from the light emitting diode, and produce luminescence.

Examples of Aluminum oxide-based fluorescent materials include $YAlO_3$:Ce, $Y_3Al_5O_{12}$:Ce, $Y_4Al_2O_9$:Ce, $(Y_{0.8}Gd_{0.2})_3Al_5O_{12}$:Ce, $Y_3(Al_{0.8}Ga_{0.2})_5O_{12}$:Ce, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$ and the like. Among which, yttrium aluminum garnet fluorescent materials (hereinafter referred to as the YAG fluorescent materials), which includes two or more types of aluminum oxide-base fluorescent materials having different composition each other, including Y, being activated by Ce or Pr, are preferable. Especially $(Re_{1-x}Sm_x)_3(Al_{1-y}Ga_y)_5O_{12}$:Ce ($0 \leq x<1$, $0 \leq y \leq 1$, Re is st least one element selected from Y, Gd, and La) and the like are preferable.

(Lutetium Aluminum Garnet-Base Fluorescent Materials)

Lutetium aluminum garnet-base fluorescent materials are fluorescent substances which is represented by the formula $(Lu_{1-a-b}R_aM_b)_3(Al_{1-c}Ga_c)_5O_{12}$ (R is at least one element selected from rare earth elements together with Ce as an essential element, M is at least one elements selected from Sc, Y, La, Gd, and $0.0001 \leq a \leq 0.5$, $0 \leq b \leq 0.5$, and $0.0001 \leq a+b<1$, $0 \leq c \leq 0.8$), as described in JP2005-8844. Examples of lutetium aluminum garnet-base fluorescent materials include $(Lu_{0.99}Ce_{0.01})_3Al_5O_{12}$, $(Lu_{0.90}Ce_{0.10})_3Al_5O_{12}$, $(Lu_{0.99}Ce_{0.01})_3(Al_{0.5}Ga_{0.5})_5O_{12}$.

(Nitride-Based Fluorescent Materials)

Nitride-based fluorescent materials are fluorescent substances which include N and at least one element selected from Be, Mg, Ca, Sr, Ba, and Zn; and at least one element selected from C, Si, Ge, Sn, Ti, Zr, and Hf; and is activated by at least one element selected from rare earth elements, as described in WO03-034508. Examples of nitride-based fluorescent materials is not particularly limited, but include $Sr_2Si_5N_8$:Eu, Pr; $Ba_2Si_5N_8$:Eu,Pr; $Mg_2Si_5N_8$:Eu,Pr; $Zn_2Si_5N_8$:Eu,Pr; $SrSi_7N_{10}$:Eu,Pr; $BaSi_7N_{10}$:Eu, Ce; $MgSi_7N_{10}$:Eu,Ce; $ZnSi_7N_{10}$:Eu,Ce; $Sr_2Ge_5N_8$:Eu,Ce; $Ba_2Ge_5N_8$:Eu,Pr; $Mg_2Ge_5N_8$:Eu,Pr; $Zn_2Ge_5N_8$:Eu,Pr; $SrGe_7N_{10}$:Eu,Ce; $BaGe_7N_{10}$:Eu,Pr; $MgGe_7N_{10}$:Eu,Pr; $ZnGe_7N_{10}$:Eu,Ce; $Sr_{1.8}Ca_{0.2}Si_5N_8$:Eu,Pr; $Ba_{1.8}Ca_{0.2}Si_5N_8$:Eu,Ce; $Mg_{1.8}Ca_{0.2}Si_5N_8$:Eu,Pr; $Zn_{1.8}Ca_{0.2}Si_5N_8$:Eu,Ce; $Sr_{0.8}Ca_{0.2}Si_7N_{10}$:Eu,La; $Ba_{0.8}Ca_{0.2}Si_7N_{10}$:Eu,La; $Mg_{0.8}Ca_{0.2}Si_7N_{10}$:Eu,Nd; $Zn_{0.8}Ca_{0.2}Si_7N_{10}$:Eu,Nd; $Sr_{0.8}Ca_{0.2}Ge_7N_{10}$:Eu, Tb; $Ba_{0.8}Ca_{0.2}Ge_7N_{10}$:Eu, Tb; $Mg_{0.8}Ca_{0.2}Ge_7N_{10}$:Eu,Pr; $Zn_{0.8}Ca_{0.2}Ge_7N_{10}$:Eu,Pr; $Sr_{0.8}Ca_{0.2}Si_6GeN_{10}$:Eu,Pr; $Ba_{0.8}Ca_{0.2}Si_6GeN_{10}$:Eu,Pr; $Mg_{0.8}Ca_{0.2}Si_6GeN_{10}$:Eu, Y; $Zn_{0.8}Ca_{0.2}Si_6GeN_{10}$:Eu, Y; $Sr_2Si_5N_8$:Pr; $Ba_2Si_5N_8$:Pr; $Sr_2Si_5N_8$:Tb; $BaGe_7N_{10}$:Ce; (Ca, Sr, Ba)$Si_2O_2N_2$:Eu; $CaSiAlN_3$:Eu; so-called Sialon and the like.

(Oxynitride-Based Materials)

Oxynitride-based materials are fluorescent substances which is represented by $L_xM_yO_zN_{[(2/3x+(4/3)y-(2/3)z]}$:R (L is at least one element selected from Be, Mg, Ca, Sr, Ba, and Zn; M is at least one element selected from C, Si, Ge, Sn, Ti, Zr, and Hf; N is nitrogen, O is oxygen, R is rare earth elements, and $x=2$, $4.5 \leq y \leq 6$, $0.01<z<1.5$, or $x=1$, $6.5 \leq y \leq 7.5$, $0.01 \leq z \leq 1.5$, or $x=1$, $1.5 \leq y \leq 2.5$, $1.5 \leq z \leq 2.5$.)

(Alkali Earth Metal Silicate-Based Materials)

Alkali earth metal silicate-based materials include (2−x−y)SrO.x(Ba,Ca)O.(1−a−b−c−d)
$SiO_2.aP_2O_5bAl_2O_3cB_2O_3dGeO_2$:$yEu^{2+}$(0<x<1.6, 0.005<y<0.5, 0<a, b, c, d<0.5);

(2−x−y)BaO.x(Sr,Ca)O.(1−a−b−c−d)
$SiO_2.aP_2O_5bAl_2O_3cB_2O_3dGeO_2$:$yEu^{2+}$(0.01<x<1.6, 0.005<y<0.5, 0<a, b, c, d<0.5); and Me(3−x−y)$MgSi_2O_3$:xEu, yMn (0.005<x<0.5, 0.005<y<0.5, Me is Ba and/or Sr and/or Ca), as described in JP2005-85895.

(Other Fluorescent Materials)

(1) Alkali earth metal halogen apatite, which is activated by Eu and/or Mn, for example, $M_5(PO_4)_3$(Cl, Br):Eu (M is at least one element selected from Sr, Ca, Ba, Mg), $Ca_{10}(PO_4)_6ClBr$:Mn,Eu and the like;

(2) alkali earth aluminate fluorescent materials, which are activated by Eu and/or Mn, for example, $BaMg_2Al_{16}O_{27}$:Eu; $BaMg_2Al_{16}O_{27}$:Eu,Mn; $Sr_4Al_{14}O_{25}$:Eu; $SrAl_2O_4$:Eu; $CaAl_2O_4$:Eu; $BaMgA_{10}O_{17}$:Eu; $BaMgAl_{10}O_{17}$:Eu,Mn and the like;

(3) rare earth oxysulfide fluorescent materials, which are activated by Eu, for example, $La_2O_2S$:Eu, $Y_2O_2S$:Eu, $Gd_2O_2S$:Eu and the like.

(4) (Zn, Cd)S:Cu, $Zn_2GeO_4$:Mn, $3.5MgO.0.5MgF_2.GeO_2$: Mn, $Mg_6As_2O_{11}$:Mn, (Mg, Ca, Sr, Ba)$Ga_2S_4$:Eu, $Ca_{10}(PO_4)_6FCl$:Sb,Mn and the like; and (5) organic complexes or the like which are activated by Eu.

The light emitted from the point light source 16 is preferably white light. For example, when just one light emitting diode is used, it is preferably one that emits white light. When two or more light emitting diodes are used, they may be a combination of the light emitting diodes that emit white light, or each light emitting diode may emit a different color of light, with the overall emitted light being white. For instance, when the light emitting diode s emit light of different colors such as red, green, and blue, mixed light of the any color can be obtained by arranging light emitting diodes having different emission colors in the z direction. When a single light emitting diode is constituted by a plurality of light emitting diode chips, white light may be obtained with a single light emitting diode using a plurality of light emitting diode chips emitting light of different colors and one or more fluorescent substances. When white light is obtained by using a combination of light emitting diodes emitting light of different colors, it is preferable to admix a diffusing agent into the cylindrical lens, as discussed below, in order to enhance color mixing.

The cylindrical lens 10 is a hollow structure, so that the light source can be disposed in the interior of the cylinder. This shape covers the light emitting observation side of the point light source 16. Employing a hollow structure allows a concave lens function and a convex lens function to be realized by the interaction of the inner and outer faces of the cylindrical lens. The "light emitting observation side" refers to the side from which the planar light source can be viewed directly, or, put another way, to the side across from the supporting substrate.

The cylindrical lens 10 has a portion 12 having the concave lens function in the direction (y direction) perpendicular to the supporting substrate, and has a portion 14 having the convex lens function in at least part of the horizontal direction (x direction). "Concave lens function" refers to a function of diffusing light by the interaction of the inner and outer faces of the cylindrical lens. "Convex lens function" refers to a function of converging a light flux by the interaction of the inner and outer faces of the cylindrical lens. These functions make it possible to realize the planar light source 123 using the point light source 16. In other words, since the light source that is the core is the point light source 16, the presence of the point light source 16 can be detected if the planar light source 123 is viewed directly through the cylindrical lens 10, but the plane illuminated by the planar light source 123 has no brightness unevenness, there are no bright spots or bright lines, and the illuminated plane has a uniform illumination distribution despite the fact that the light is not emitted uniformly in planar fashion. For the cylindrical lens 10, the focal position of one portion 14 having the convex lens function is suitable to be disposed below the supporting substrate surface, and preferably to be disposed at the space from the center of the hollow structure of the cylindrical lens 10 to the side of another portion having the convex lens function.

Figure 1B:
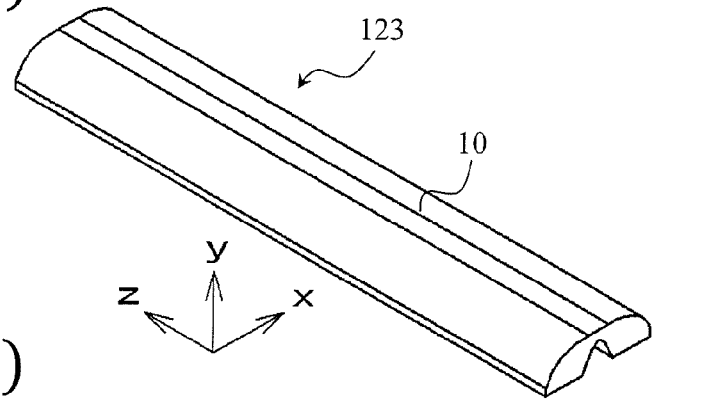
FIG. 1(b) is an oblique view thereof.
Figure 1C:
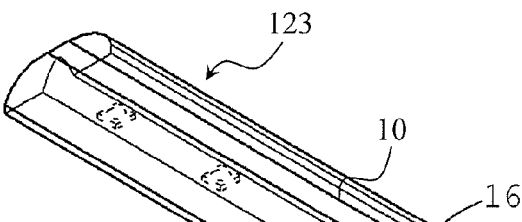
FIG. 1(c) is a see-through oblique view.
Figure 1D:
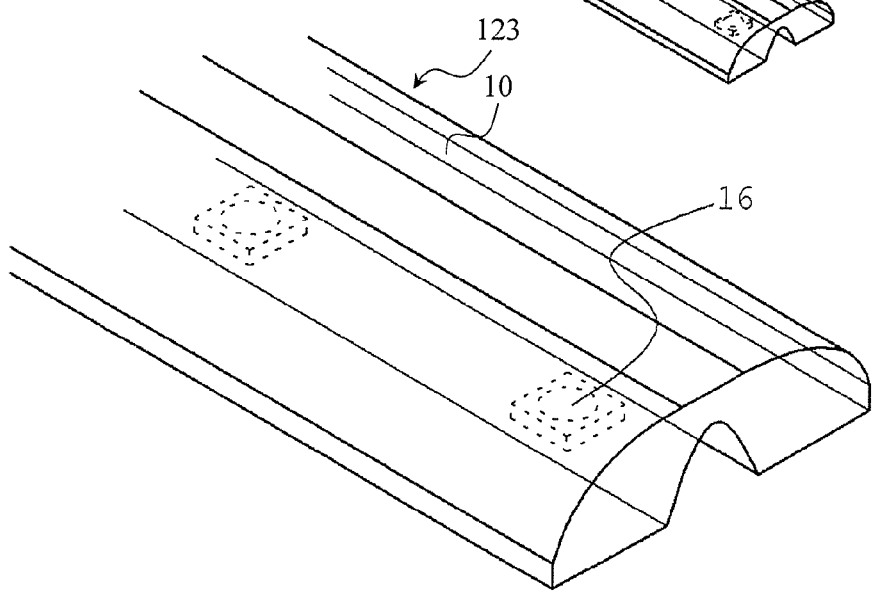
FIG. 1(d) is a detail oblique view of the main components.
Figure 2A:
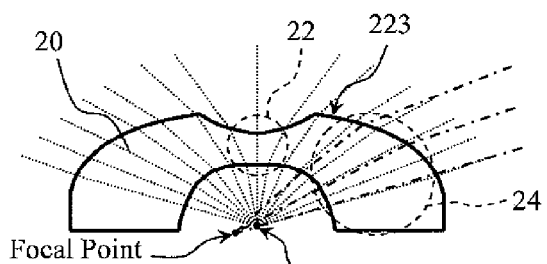
FIG. 2(a) is a side view of an embodiment of the planar light source of the present invention.
Figure 2B:
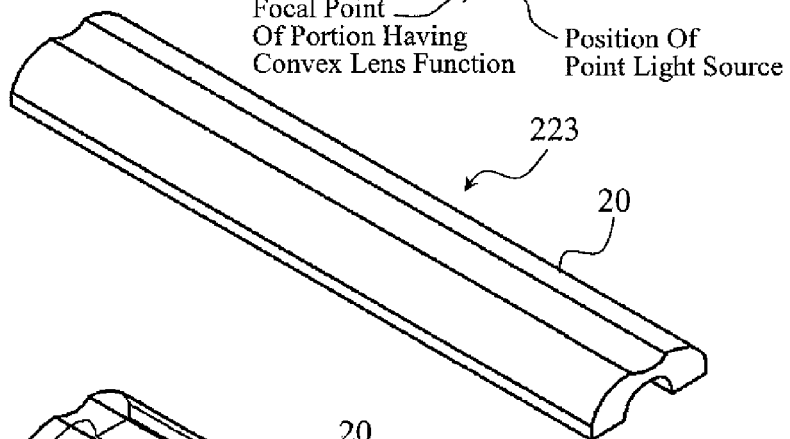
FIG. 2(b) is an oblique view thereof.
Figure 2C:
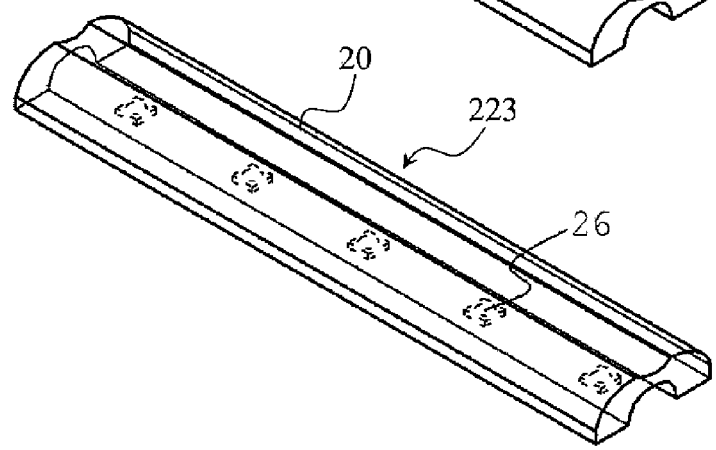
FIG. 2(c) is a see-through oblique view.
Figure 2D:
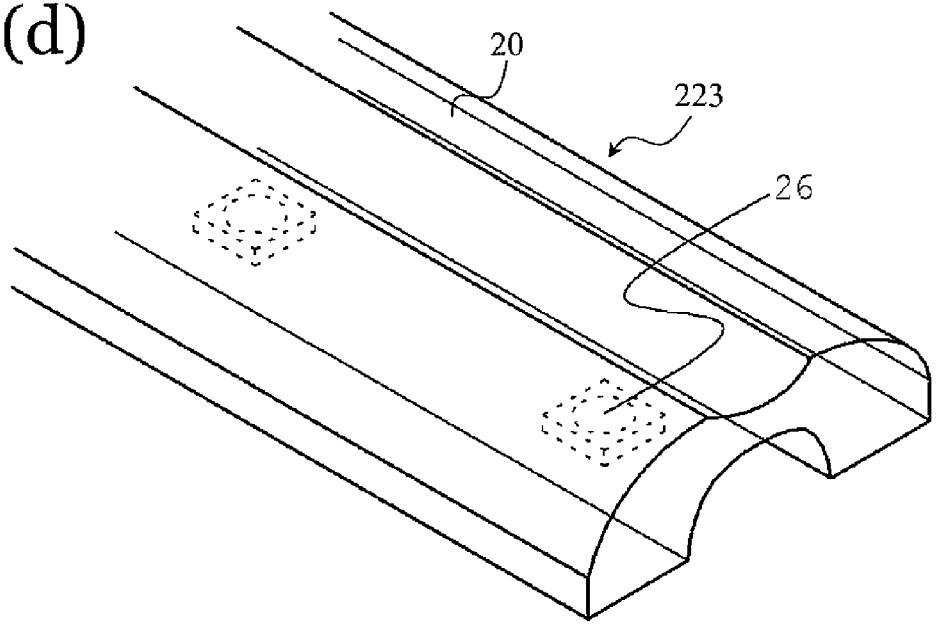
FIG. 2(d) is a detail oblique view of the main components.
Figure 4A:
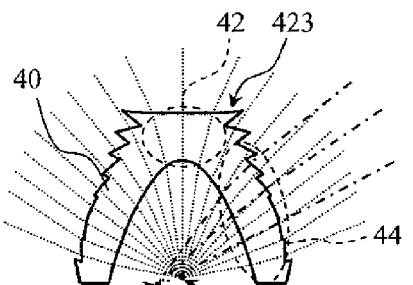
FIG. 4(a) is a side view of an embodiment of the planar light source of the present invention.
Figure 4B:
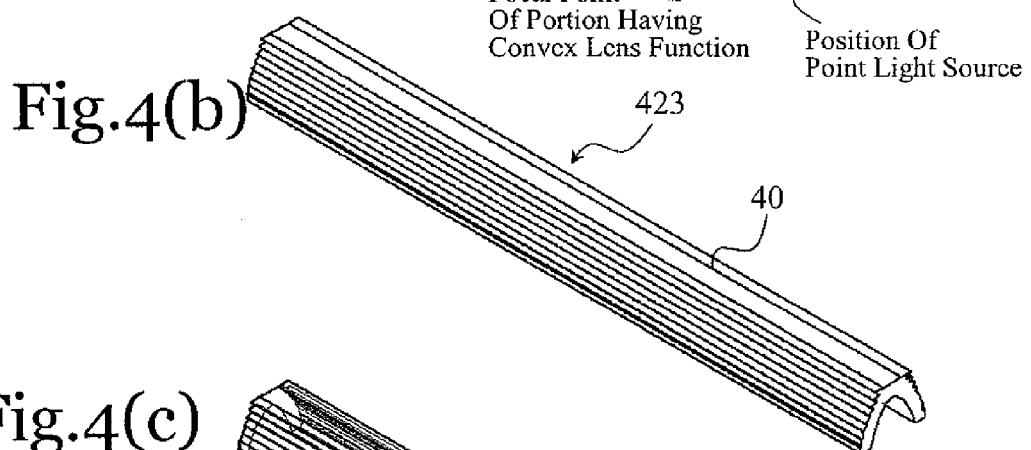
FIG. 4(b) is an oblique view thereof.
Figure 4C:
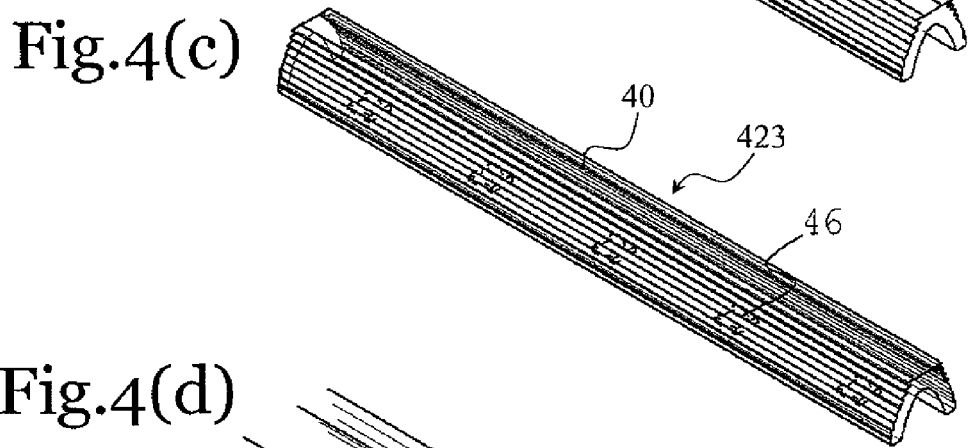
FIG. 4(c) is a see-through oblique view.
Figure 4D:
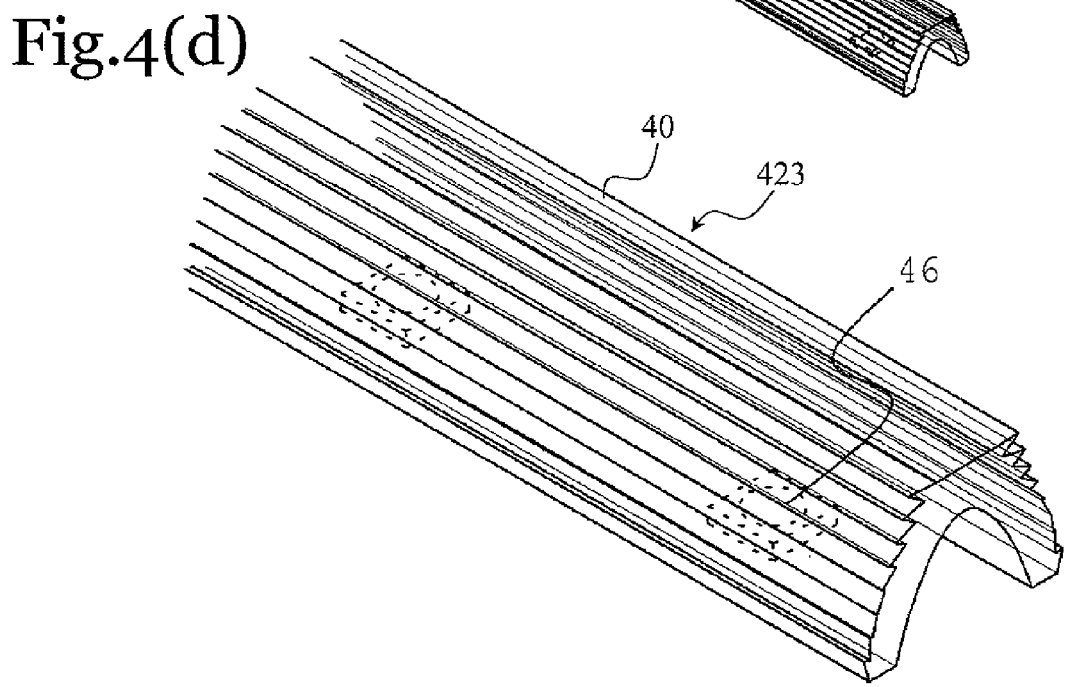
FIG. 4(d) is a detail oblique view of the main components.
Figure 5A:
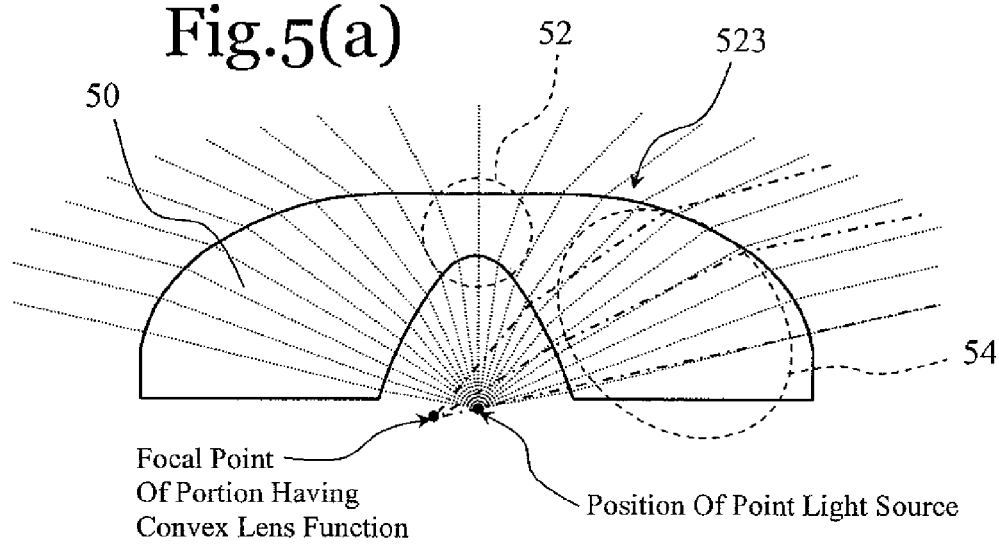
FIG. 5(a) is a side view of an embodiment of the planar light source of the present invention.
Figure 5B:
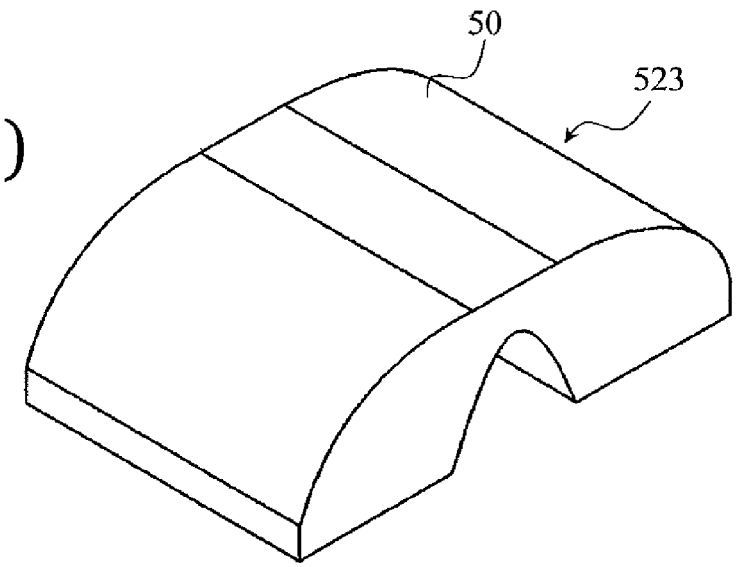
FIG. 5(b) is an oblique view thereof.
Figure 5C:
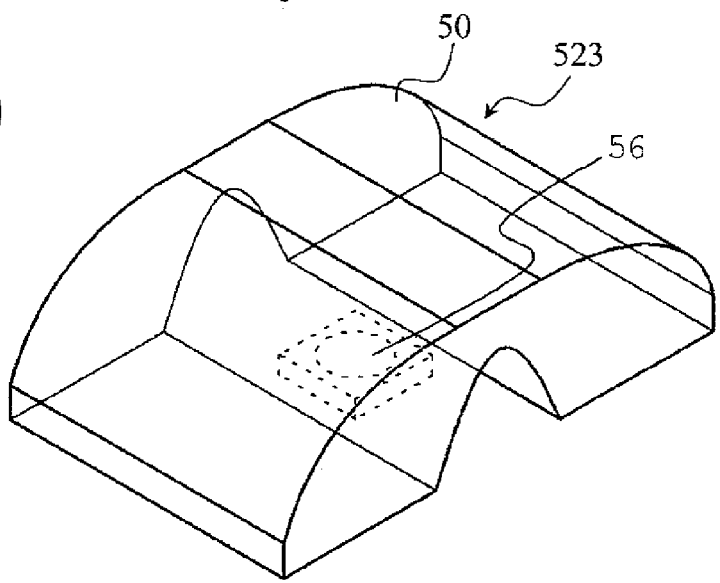
FIG. 5(c) is a see-through oblique view.
Figure 6A:
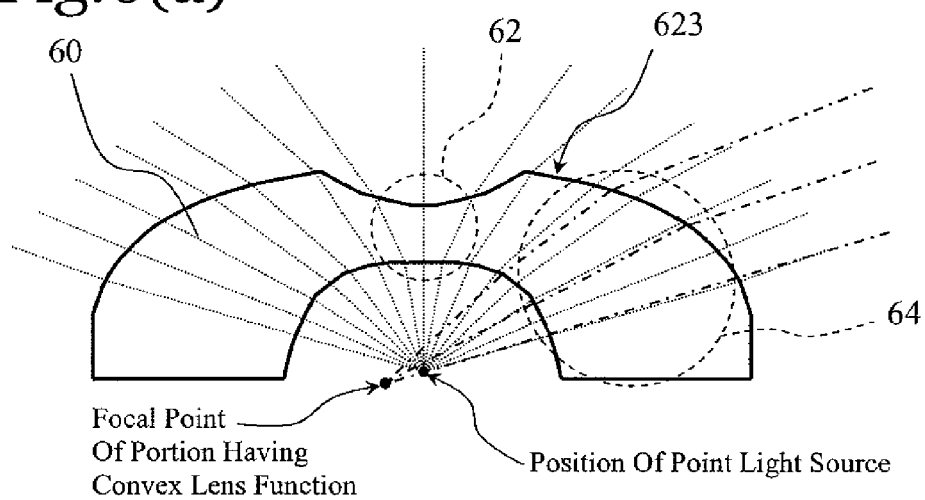
FIG. 6(a) is a side view of an embodiment of the planar light source of the present invention.
Figure 6B:
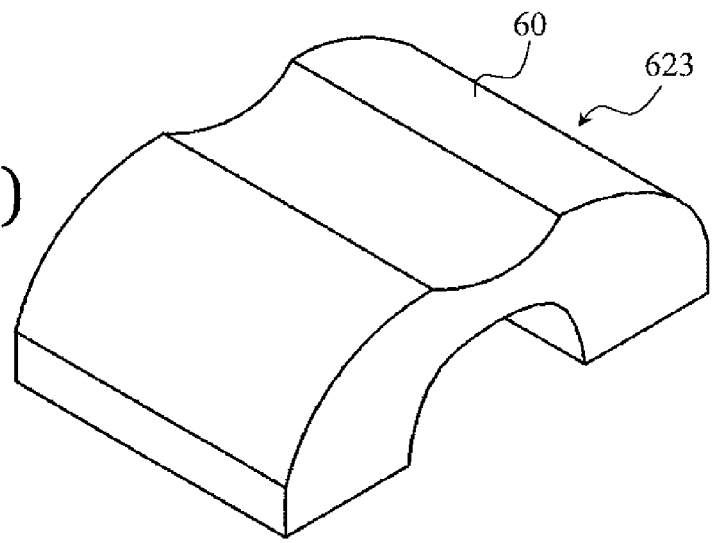
FIG. 6(b) is an oblique view thereof.
Figure 6C:
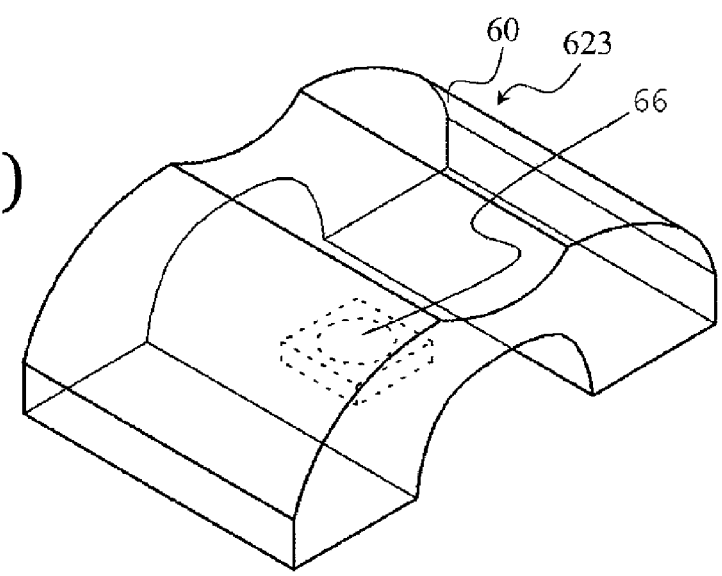
FIG. 6(c) is a see-through oblique view.
Figure 7A:
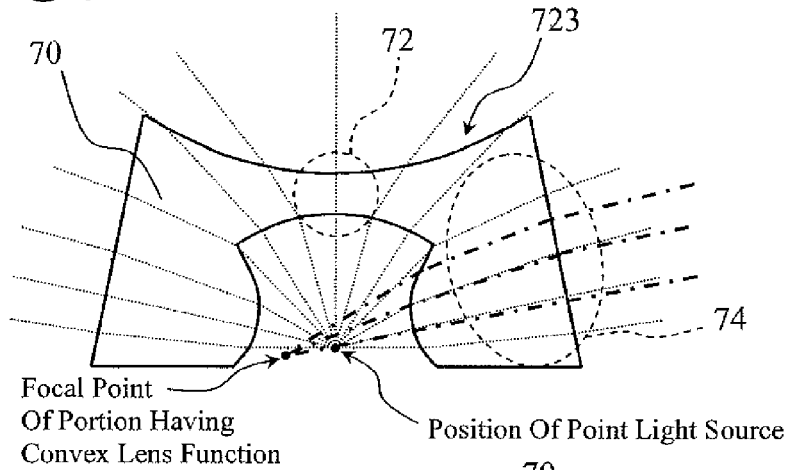
FIG. 7(a) is a side view of an embodiment of the planar light source of the present invention.
Figure 7B:
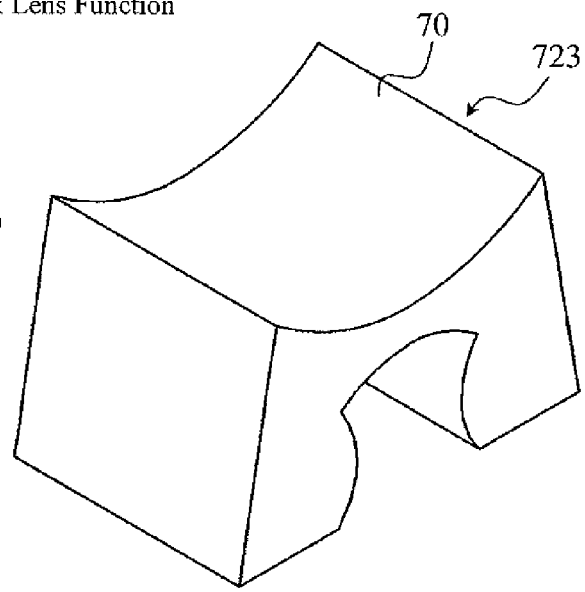
FIG. 7(b) is an oblique view thereof.
Figure 7C:
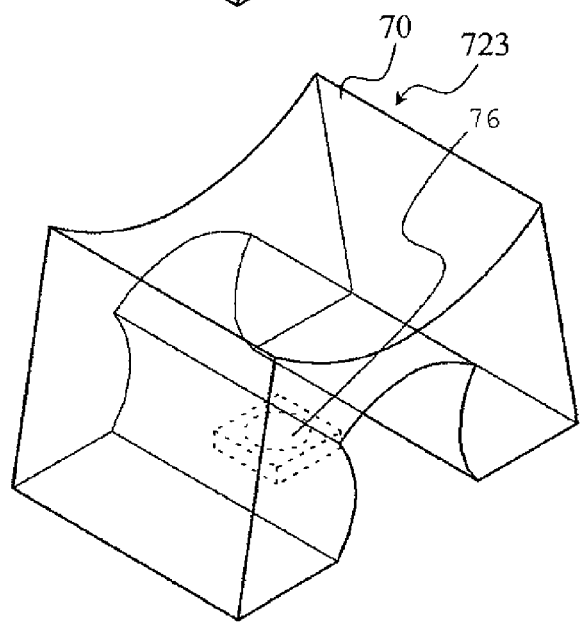
FIG. 7(c) is a see-through oblique view.
Figure 8A:
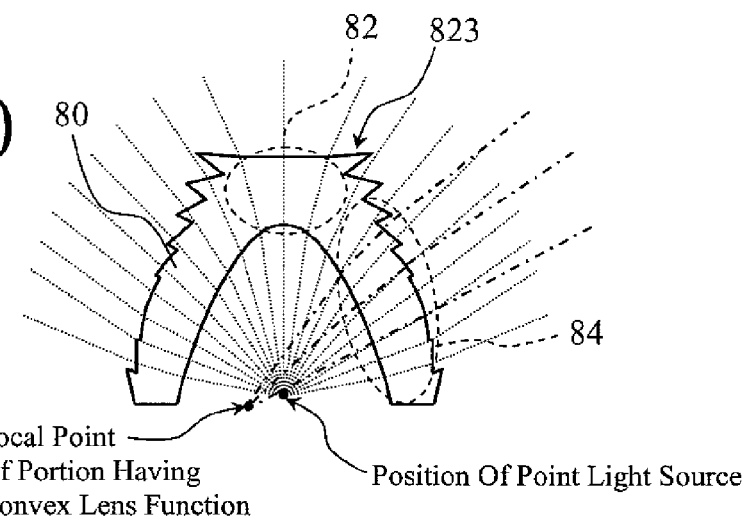
FIG. 8(a) is a side view of an embodiment of the planar light source of the present invention.
Figure 8B:
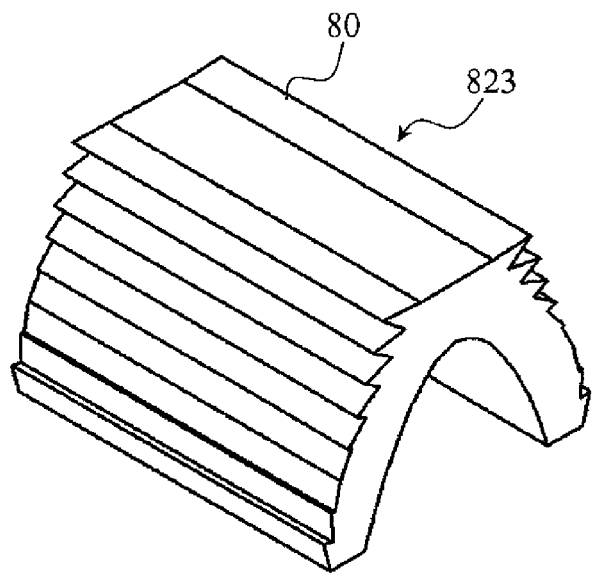
FIG. 8(b) is an oblique view thereof.
Figure 8C:
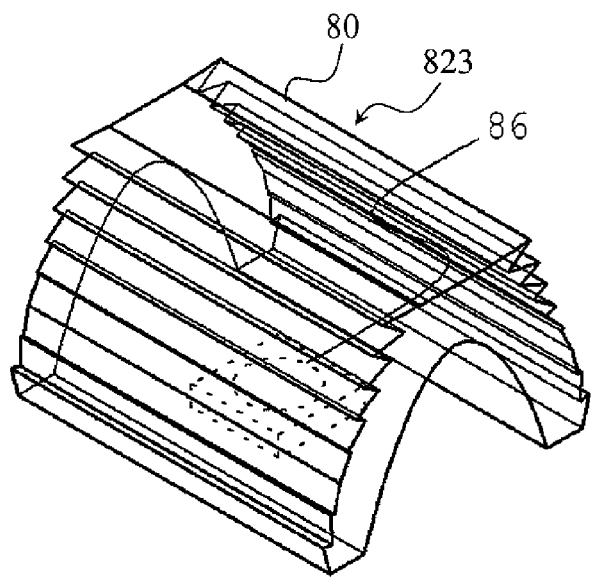
FIG. 8(c) is a see-through oblique view.
Figure 12:
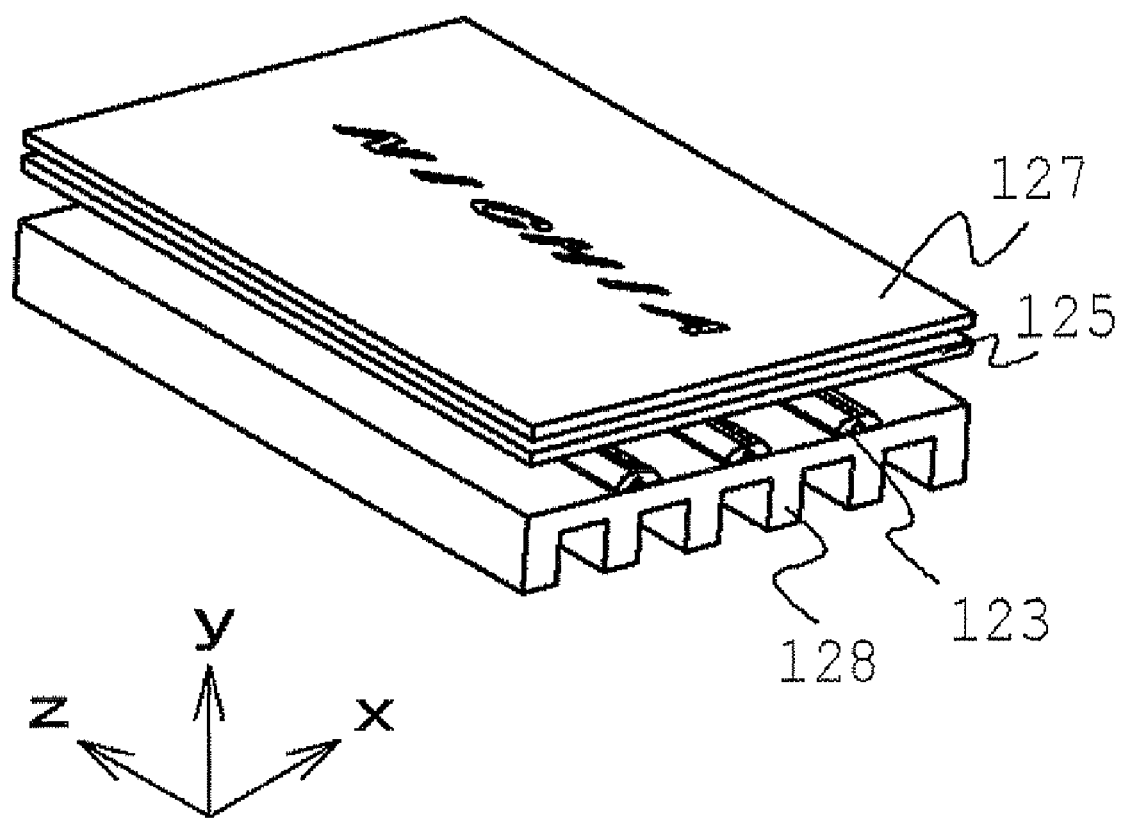
FIG. 12 is an oblique view of an embodiment of the backlight light source using the planar light source of the present invention.

In this Specification, as shown in FIG. 1(b) and FIG. 12, the "x direction" is in the horizontal direction relative to the supporting substrate, and refers to the direction perpendicular to the longitudinal direction of the cylindrical lens 10, while the "y direction" refers to the direction perpendicular to the supporting substrate. The "z direction," which will be discussed below, is in the horizontal direction relative to the supporting substrate, and refers to the longitudinal direction of the cylindrical lens 10. The xyz direction intersects perpendicularly, respectively. As will be discussed below, when the shape of the cylinder lens extending in the longitudinal direction is other than linear, the z direction can also be defined as the direction perpendicular to both the x and y directions. However, it is not necessary to catch strictly a perpendicular direction (y direction) and a horizontal direction (x directions), and they can be regarded as the direction which faces a supporting substrate, and the direction of their both sides, respectively.

The cylindrical lens 10 may be formed from any material as long as it is translucent and allows the lens functions to be realized. It is particularly favorable for it to be formed from a material having at least a specific translucency with respect to light of a wavelength from near ultraviolet, through visible light, and up to near infrared. More specifically, from the standpoints of translucency, workability, and so forth, suitable materials include acrylic resin, polycarbonate resin, amorphous polyolefin resin, polystyrene resin, norbornene-based resin, cycloolefin-based polymer (COP), epoxy resin, silicone resin, acrylonitrile-butadiene-styrene resin (ABS resin), sapphire, quartz, soda glass, borosilicate glass, silica glass, oxynitride glass, rear earth glass, and so on. Of these, an acrylic resin is preferred because it has high translucency and undergoes little yellowing due to optical degradation, so there is less decrease in output over time. Also, because of its excellent impact resistance, a polycarbonate resin is favorable when the product will be used in a mechanically harsh environment. A cylindrical lens with a refractive index of 1.3 to 2.0, for example, can be used favorably.

The entire cylindrical lens 10 may be formed from the same material, but the portion 12 having the concave lens function and the portion 14 having the convex lens function may be made of materials of different refractive indices. More specifically, it is preferable for the material that forms the portion 12 having the concave lens function to have a lower refractive index than the material that forms the portion 14 having the convex lens function. The lens functions are realized by the difference in refractive indices, and since a better lens function can be obtained at a higher refractive index, it is preferable for the portion 14 having the convex lens function to have a higher refractive index. The same applies to the portion 12 having the concave lens function, but if the refractive index is too high, total reflection will be apt to occur and there will be a decrease in the light take-off efficiency. Thus, the optimal value for refractive index is different for the portion 14 having the convex lens function and for the portion 12 having the concave lens function. Therefore, it is preferable to select the best material and suitably adjust the refractive index for each according to the desired orientation characteristics and so forth of the planar light source 123.

As discussed below, depending on the point light source 123 being used, a diffusing agent may be admixed into just the portion 12 of the cylindrical lens 10 having the concave lens function. Examples of this diffusing agent include barium titanate, titanium oxide, aluminum oxide, silicon oxide, calcium carbonate, white carbon, talc, and magnesium carbonate, one or more of which may be used. This diffusing agent may be used singly and as a combination thereof. This allows the light to be effectively diffused at the portion 12 of the concave lens, and as a result, bright spots and bright lines, which are most likely to occur the portion directly above the point light source 16, can be prevented. Also, when a multi-color light source is used as the point light source 16, better color mixing can be anticipated, and the occurrence of bright spots and bright lines can be suppressed. Meanwhile, when a diffusing agent is used, light will be diffused even though the optical characteristics are controlled by the lens function resulting from the shape of the cylindrical lens 10. Therefore, it is preferable to admix a diffusing agent in only the concave lens portion (the portion 12 having the concave lens function), which is the portion with the shorter optical path length. This allows color mixing to be improved without diminishing the function of the convex lens part (the portion 14 having the convex lens function). Furthermore, the above-mentioned fluorescent substance may be admixed in or applied on all or part of the cylindrical lens 10, and all or part of the inner face and/or outer face thereof may be coated.

There are no particular restrictions on the shape of the cylinder, which may be in the form of a straight line extending in the longitudinal direction, or a curve, an arch, a bent line, an L shape, a circle, or the like. Also, when just one point light source 16 is covered, the lens may be in the form of a cup, dome, or the like having a void in its middle portion. Regardless of the number of point light sources 16, it is preferable at the end of the cylindrical lens 10 that it is the form which covers a point light source. The cylindrical 10 lens may be an integrated type, or may be divided into parts that are mechanically and physically separate, but are all linked together and function integrally.

FIGS. 2(a)-2(d), 3(a)-3(d), 4(a)-4(d), 5(a)-5(d), 6(a)-6(d), 7(a)-7(d) and 8(a)-8(c) illustrate alternative structures of planar light sources 223, 323, 423, 523, 623, 723 and 823, respectively, in accordance with the present invention. The planar light sources 223, 323, 423, 523, 623, 723 or 823 includes at least one point light source 26, 36, 46, 56, 76 or 86 and a cylindrical lens 20, 30, 40, 50, 60, 70 or 80. The cylindrical lens 20, 30, 40, 50, 60, 70 or 80 includes a portion 22, 32, 42, 52, 62, 72 or 82 that has a concave lens function and a portion 24, 34, 44, 54, 64, 74 or 84 that has a convex lens function. With the planar light source 123 (223, 323 or 423) of the present invention, two or more point light sources 16 (26, 36 or 46) may be disposed in a row on the supporting substrate (lined up in the longitudinal direction of the supporting substrate) as shown in FIGS. 1 to 4, or just one point light source 56 (66, 76 or 86) may be disposed, as shown in FIGS. 5 to 8. The length of the planar light source 123 to 823 in the z direction will vary, but can be broadly divided into groups which have in common the shape of the xy plane (the groups including the planar light sources 123 and 523 in FIGS. 1 and 5, the groups including the planar light sources 223 and 623 in FIGS. 2 and 6, the groups including the planer light sources 323 and 723 in FIGS. 3 and 7, and the groups including the planar light sources 423 and 823 in FIGS. 4 and 8). The xyz direction is shown in FIG. 1. The supporting substrate is not shown in the drawings.

The cylindrical lenses 10 and 50 shown in FIGS. 1 and 5, respectively, are the least apt to result in the occurrence of bright spots and dark lines because there is no inflection plane or line between the concave lens part (the portion 12 or 52) and convex lens part (the portion 14 or 54) in the xy plane. In this case, the concave lens function is realized by just the inner surface of the cylindrical lens 10 or 50, so the convex angle of the inner surface is preferably acute.

With the cylindrical lenses 20 and 60 shown in FIGS. 2 and 6, the concave lens function (the portion 22 or 62) is realized by both the inner surface and the outer surface of the cylindrical lens 20 or 60, so the concave lens function (the portion 22 or 62) can be made stronger than with the group shown in FIGS. 1 and 5.

The cylindrical lenses 30 and 70 shown in FIGS. 3 and 7 afford the strongest concave lens function (the portion 32 or 72). On the other hand, since the convex lens function (the portion 34 or 74) is realized by just the inner surface, the convex lens function is relatively weak.

The cylindrical lenses 40 and 80 shown in FIGS. 4 and 8 have been machined into a Fresnel lens. This allows the lens to be thinner and more lightweight than in the other embodiments.

With the present invention, the point light source 16 (26, 36, 46, 56, 66, 76 or 86) is preferably disposed between the focal points of the portions 14 (24, 34, 44, 54, 64, 74 or 84) of the cylindrical lens 10 (20, 30, 40, 50, 60, 70 or 80) having a convex lens function. In other wards, the point light source 16 (26, 36, 46, 56, 66, 76 or 86) is preferably disposed between one cylindrical lens 10 (20, 30, 40, 50, 60, 70 or 80) having a convex lens function and the focal point of the cylindrical lens 10 (20, 30, 40, 50, 60, 70 or 80). Disposing in this position allows the light that has passed through the cylindrical lens to be scattered, without becoming parallel light and without the light rays moving closer together, while the desired converging performance is maintained, which makes it possible to reduce the effect of the brightness unevenness of the light source.

Figure 10:
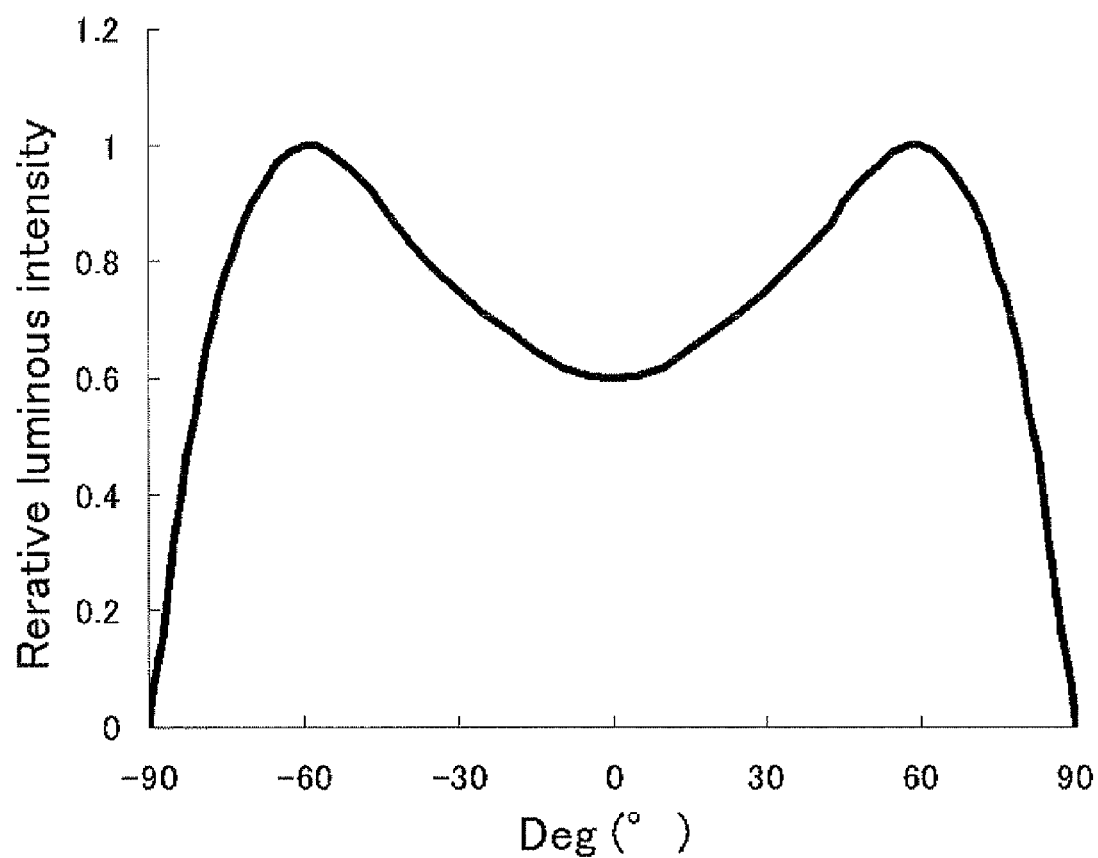
FIG. 10 is a graph showing batwing light distribution characteristics.
Figure 11:
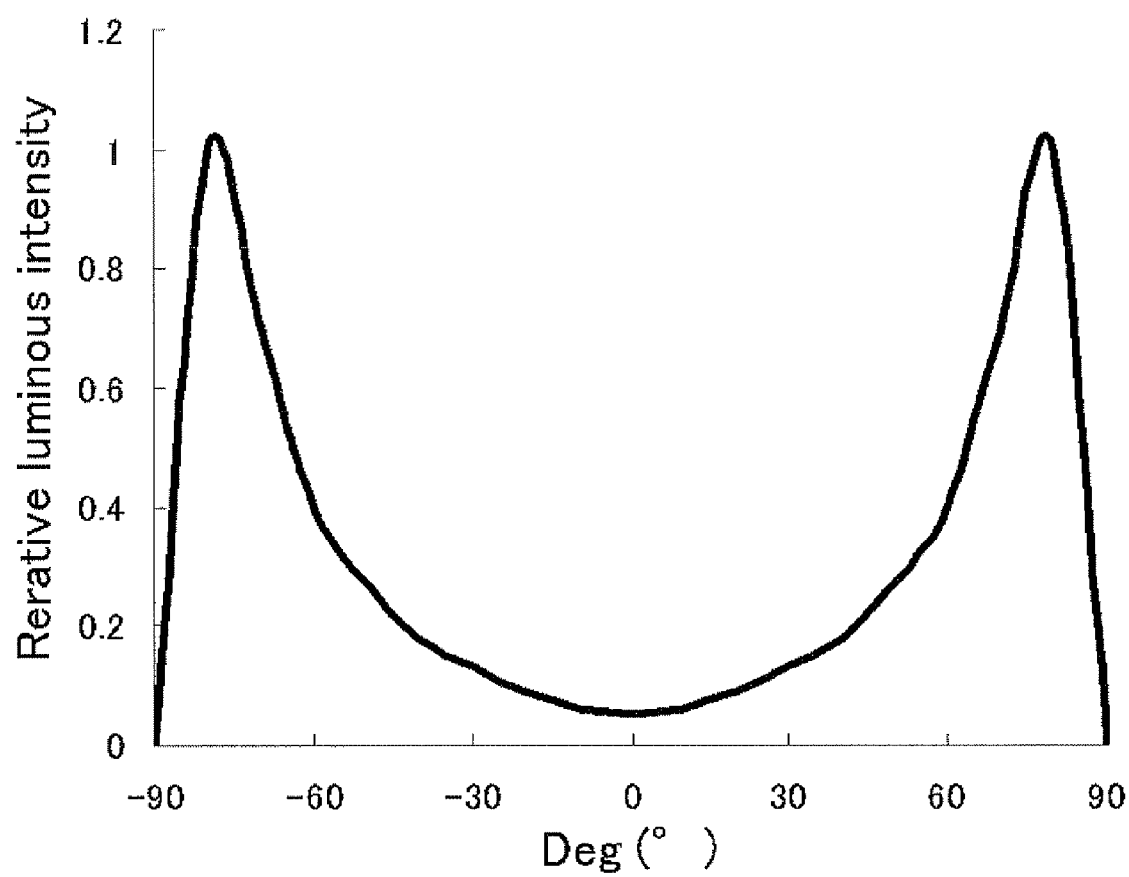
FIG. 11 is a graph showing side emitter light distribution characteristics.

Also, the light emitted from the planar light source 123 (223, 323, 423, 523, 623, 723 or 823), that is, light that has passed through the cylindrical lens 10 (20, 30, 40, 50, 60, 70 or 80), preferably has orientation characteristics that have two peaks that are in right and left symmetry relative to the xy plane. The phrase "orientation characteristics that have two peaks that are in right and left symmetry" refers to light distribution having two light emission intensity peaks in a direction different from the perpendicular direction to the surface of the supporting substrate, and having intensity peaks that are symmetrical to the perpendicular direction on either side of the perpendicular direction. Such light emission characteristics are also called batwing light distribution characteristics (FIG. 10) and side emitter light distribution characteristics (FIG. 11). This allows the planar light sources to have a uniform illumination distribution within allover the illuminated surface.

Working Example 1

In this working example, as shown in FIG. 12, an image display device is equipped with a backlight light source involving the planar light source 123 that is a combination of a cylindrical lens 10 of the type shown in FIG. 1 and a light emitting diode having Lambertian light distribution characteristics.

This is a structure in which the metal heat sink 128 is used as a supporting substrate to improve heat dissipation and increase the amount of current flowing into the light emitting diode.

The planar light sources 123 of the present invention are disposed on this metal heat sink 128, which is used to diffuse heat from the light emitting diode and radiate it to the outside, at a suitable spacing determined by the light distribution characteristics and the distance between the light sources and the illuminated surface, which affords a light source device having a uniform illumination distribution, in which no bright spots, dark lines, or the like is seen in the illuminated surface.

The "illuminated surface" here refers to a diffuser board 125, prism sheet (not shown), and polarization converter (not shown), or to a display panel 127 (such as an LCD or printed film) consisting of a combination of these.

In large applications such as store signs or tunnel signage, there is no need for the diffuser board 125 or the like because of the stronger interference effect between the planar light sources 123, so the same effect can be achieved with just the display panel 127.

Using the planar light source 123 of the present invention has a backlight light source of this configuration makes it possible to shorten the distance, which must be extended in order to prevent bright point and bright line, between the light source and the illuminated surface, and results in a device that is thinner overall.

Working Example 2

Figure 13:
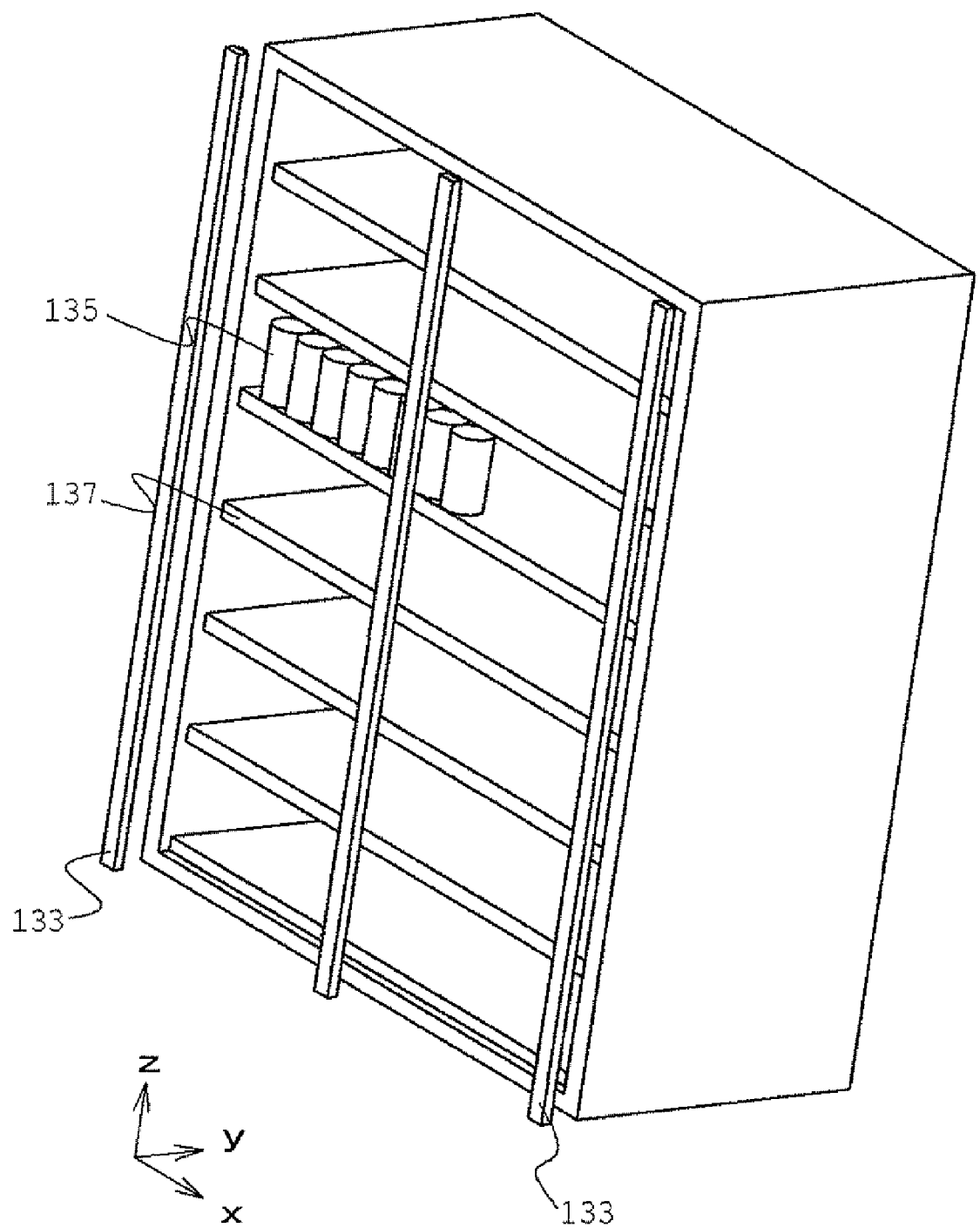
FIG. 13 is an oblique view of an embodiment of the display refrigerator using the planar light source of the present invention.

As shown in FIG. 13, this working example constitutes a planar lighting apparatus for a display refrigerator for displaying beverages 135 or the like installed in a convenience store or the like and equipped with a planar light source 133.

The refrigerator was 1600 mm tall, the space between the columns at the ends of the glass doors was 762 mm (30 inches), planar light sources 133 were laid out on the back of the columns in a row equal in length to the height of the refrigerator and facing the illuminated surface, and the distance between the light source and the surface of the displayed merchandise (the illuminated surface) was 177.8 mm (7 inches).

The cylindrical lens used here was injection molded from an acrylic resin, and measured 19.26 mm in the x direction, 6.1 mm in the y direction, and 400 mm in the z direction. The thickness in the x direction (the thickness of the convex lens) was 10 mm, and the thickness in the y direction (the thickness of the concave lens) was 2 mm. The structure used here covered five light emitting diodes lined up at regular intervals (80 mm) for each cylindrical lens. The light emitting diodes were disposed on the surface of the supporting substrate, in the middle in the x direction of the hollow space of the cylindrical lens. This means that the light emitting diodes were disposed between the focal point of one cylindrical lens having the convex lens function and the focal point of another cylindrical lens having the convex lens function, or between the focal point of the cylindrical lens having the convex lens function, in this case the focal points of the cylindrical lens having the convex lens function is disposed below the supporting substrate surface. Light emitting diodes with a brightness of at least 80 lm each were used. Each column included four cylindrical lenses and 20 light emitting diodes.

The light distribution of the planar light sources used here was controlled so that there would be two peaks near ±80 degrees in the x direction, and the intensity would be no more than 10% of the peak at 0 degrees.

FIG. 14 shows the illuminance distribution of the illuminated surface from each of the planar light sources. The graph in FIG. 14 shows illuminated surface illuminance distribution for each row, while FIG. 15 shows the total illuminated surface illuminance distribution of these planar light sources. It can be seen from FIG. 15 that a uniform illuminance distribution was obtained over substantially the entire surface.

When such planar light sources are used in a display refrigerator with the above structure, a uniform illuminance distribution averaging 1000 lux can be attained, with no bright spots, bright lines and dark lines, or the like seen on the surface of the displayed merchandise.

When the present invention is used, there is no need for a light source heater, which is required when ordinary fluorescent lamps are used, and no light is radiated to the rear of the light source because of the function of the cylindrical lens, so no unnecessary light gets in the eyes of shoppers, which would otherwise be distracting.

Also, when a fluorescent lamp is used, its non-directional characteristics mean that the front of the light source (that is, the back of the column) is brightest, while the middle part of the merchandise rack is only darkly illuminated, but when the present invention is used instead, uniform illumination is possible, which is bright all the way to the middle of the merchandise rack 137.

Working Example 3

Working Example 3 is a light source apparatus used for passage illumination, and installed on the ceiling of an underground passageway in a dam or the like. In a location such as this, outside light is completely blocked off, and the walkway is only wide enough to allow workers to walk through in single file, so illumination that is adequate for moving about and working is obtained with just the brightness of a light emitting diode. In addition, since maintenance is more difficult in such locations, the long service life of light emitting diodes is especially valuable. Because of the unique functions produced by the light distribution characteristics of the present invention, not only the floor, but also the side walls of the passage can be brightly illuminated, which means that this lighting apparatus affords more than enough illumination for safe movement and for inspection and repair work.

The present invention can be applied to various kinds of lighting, such as backlights for various display devices such as liquid crystal displays which need to be especially thin and lightweight, backlights for simple signs and so forth, display refrigerators and display racks, general lighting, and so forth.

This application claims priority to Japanese Patent Application No. 2005-62264. The entire disclosure of Japanese Patent Application No. 2005-62264 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A planar light source comprising at least one point light source disposed on a supporting substrate, and a cylindrical lens covering the point light source,
   wherein the cylindrical lens has
       a concave lens portion having a first inner surface and a first outer surface with a distance between the first inner surface and the first outer surface at a center region of the concave lens portion being smaller than a distance between the first inner surface and the first outer surface at a peripheral region of the concave lens portion in a cross sectional plane (x-y plane) taken along the direction (x direction) parallel to the supporting substrate and the direction (y direction) perpendicular to the supporting substrate to achieve a concave lens function with respect to a first group of light rays emitted from the point light source generally in the direction (y direction) perpendicular to the supporting substrate when the first group of light rays passes through the first inner surface and the first outer surface, and
       a convex lens portion having a second inner surface and a second outer surface with a distance between the second inner surface and the second outer surface at a center region of the convex lens portion being larger than a distance between the second inner surface and the second outer surface at a peripheral region of the convex lens portion in the cross sectional plane (x-y plane) to achieve a convex lens function with respect to a second group of light rays emitted from the point light source generally in the direction (x direction) parallel to the supporting substrate when the second group of light rays passes through the second inner surface and the second outer surface, and
   the point light source is disposed between the convex lens portion of the cylindrical lens and the focal point of the convex lens portion of the cylindrical lens.

2. The planar light source according to claim 1, wherein the point light source has orientation characteristics with a cosine curve relative to the x and y directions, and light that has passed through the cylindrical lens has orientation characteristics that have two peaks and are in right and left symmetry relative to the x and y directions.

3. The planar light source according to claim 1, wherein the cylindrical lens is a hollow structure having a space between itself and the point light source.

4. The planar light source according to claim 1, wherein the cylindrical lens is formed from one or more materials selected from the group consisting of acrylic resin, polycarbonate resin, amorphous polyolefin resin, polystyrene resin, norbornene-based resin, cycloolefin-based polymer (COP), epoxy resin, silicone resin, acrylonitrile-butadiene-styrene resin (ABS resin), sapphire, quartz, soda glass, borosilicate glass, silica glass, oxynitride glass, and rear earth glass.

5. The planar light source according to claim 1, wherein the cylindrical lens is composed of a material having different refractive indices in a portion having the concave lens function and in a portion having the convex lens function, and the material forming the portion having the concave lens function has a lower refractive index than the material forming the portion having the convex lens function.

6. The planar light source according to claim 1, wherein a diffusing agent is admixed in only the concave lens portion of the cylindrical lens.

7. The planar light source according to claim 1, wherein the point light source is a light emitting diode.

8. The planar light source according to claim 7, wherein the light emitting diode is a surface mount type.

9. The planar light source according to claim 7, wherein the light emitting diode emits white light.

10. The planar light source according to claim 9, wherein the point light source is constituted by a light emitting diode comprising light emitting diode chip and a fluorescent substance that converts the wavelength of light emitted by the light emitting diode chip, and light emitted from the point light source is mixed-color light comprising light emitted from the light emitting diode chip and transmitted through the fluorescent substance and light emitted from the light emitting diode chip and converted by the fluorescent substance.

11. The planar light source according to claim 9, wherein the point light source is constituted by a single light emitting diode including a plurality of light emitting diode chips, and light emitted from the point light source is white light produced by color-mixing the light from the plurality of light emitting diode chips.

12. The planar light source according to claim 9, wherein light emitted from the point light source is white light produced by color-mixing the light from a plurality of light emitting diodes.

13. A planar lighting apparatus comprising a plurality of the planar light sources according to claim 1 installed in the x direction at regular intervals.

14. The planar light source according to claim 1, wherein
the first inner surface of the concave lens portion and the second inner surface of the convex lens portion continuously extend without an inflection plane being formed therebetween.

15. The planner light source according to claim 1, wherein
the first outer surface of the concave lens portion and the second outer surface of the convex lens portion continuously extend without an inflection plane being formed therebetween.

16. The planner light source according to claim 1, wherein
the first outer surface of the concave lens portion is a curved surface.

17. The planner light source according to claim 1, wherein
the concave lens portion is arranged to diffuse the first group of light rays passing through the first inner surface and the first outer surface, and
the convex lens portion is arranged to converge the second group of light rays passing through the second inner surface and the second outer surface.

* * * * *